United States Patent
Zhong et al.

(10) Patent No.: US 11,804,553 B2
(45) Date of Patent: Oct. 31, 2023

(54) TRANSITION METAL DICHALCOGENIDE TRANSISTOR AND PREPARATION METHOD THEREOF

(71) Applicant: SHANGHAI IC R&D CENTER CO., LTD., Shanghai (CN)

(72) Inventors: Min Zhong, Shanghai (CN); Shoumian Chen, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 475 days.

(21) Appl. No.: 17/280,825

(22) PCT Filed: May 5, 2019

(86) PCT No.: PCT/CN2019/085522
§ 371 (c)(1),
(2) Date: Mar. 26, 2021

(87) PCT Pub. No.: WO2020/062867
PCT Pub. Date: Apr. 2, 2020

(65) Prior Publication Data
US 2021/0408296 A1 Dec. 30, 2021

(30) Foreign Application Priority Data
Sep. 26, 2018 (CN) .......................... 201811124074.0

(51) Int. Cl.
*H01L 29/786* (2006.01)
*H01L 21/02* (2006.01)
*H01L 29/66* (2006.01)

(52) U.S. Cl.
CPC .. *H01L 29/78696* (2013.01); *H01L 21/02417* (2013.01); *H01L 29/66742* (2013.01); *H01L 29/78618* (2013.01)

(58) Field of Classification Search
CPC ......... H01L 29/78618; H01L 29/66742; H01L 29/78696; H01L 21/02417;
(Continued)

(56) References Cited

U.S. PATENT DOCUMENTS 10,516,061 B2 * 12/2019 Yeh ................... H01L 29/41725
11,171,239 B2 * 11/2021 Naylor .............. H01L 29/78696
(Continued)

FOREIGN PATENT DOCUMENTS

CN 108039373 A1 5/2018

OTHER PUBLICATIONS

Rajesh, K. et al., "Phase-engineered Low-resistance Contacts for Ultrathin MoS2 Transistors", Nature Materials, vol. 13, Aug. 31, 2014 (Aug. 31, 2014), pp. 1129-1130, and figure 2d.

*Primary Examiner* — Eduardo A Rodela
(74) *Attorney, Agent, or Firm* — TIANCHEN LLC.; Yuan R. Li; Yi Fan Yin (57) ABSTRACT

A transition metal dichalcogenide transistor, comprising: a gate, a gate dielectric layer and a channel layer from bottom to top, a source/drain region are located on both the sides of the gate dielectric layer, wherein, in a plane paralleled to the channel layer, the length of the channel layer in each direction is greater than the length of the gate dielectric layer, and the length of the gate dielectric layer in each direction is greater than or equal to the length of the gate; wherein, the source/drain region are a first transition metal dichalcogenide with metallic properties, and the channel layer is a second transition metal dichalcogenide with semiconductor properties. The present invention provides a transition metal dichalcogenide transistor and a preparation method thereof, which can solve a problem of excessive contact resistance between a transition metal dichalcogenide transistor channel and a source/drain region and can make
(Continued)

the transition metal dichalcogenide transistor compatible with the existing CMOS process.

11 Claims, 5 Drawing Sheets

(58) Field of Classification Search
CPC ......... H01L 21/02485; H01L 21/02568; H01L 31/0324; H01L 29/1025; H01L 27/14616
See application file for complete search history.

(56) References Cited

U.S. PATENT DOCUMENTS

| | | | |
|---|---|---|---|
| 11,171,243 B2* | 11/2021 | Dewey | H01L 27/0922 |
| 2022/0199812 A1* | 6/2022 | Naylor | H01L 21/02568 |

* cited by examiner

TRANSITION METAL DICHALCOGENIDE TRANSISTOR AND PREPARATION METHOD THEREOF

CROSS-REFERENCE TO RELATED APPLICATION

This application claims priority of International Patent Application Serial No. PCT/CN2019/085522, filed May 5, 2019, which is related to and claims priority of Chinese patent application Serial No. 201811124074.0, Sep. 26, 2018. The entirety of each of the above-mentioned patent applications is hereby incorporated herein by reference and made a part of this specification.

TECHNICAL FIELD

The disclosure relates to the field of semiconductor integrated circuit manufacturing, in particular to a transition metal dichalcogenide transistor and a preparation method thereof.

BACKGROUND

With critical dimension of semiconductor devices shrinks according to the Moore's law, chip integration continues to increase, traditional silicon-based semiconductor devices have been difficult to meet performance and power requirements of devices and circuits due to process limitations and various negative effects. Major scientific research institutions and semiconductor manufacturers at home and abroad have studied various new materials and new device structures in order to replace existing silicon semiconductor devices.

Graphene has become a research hotspot because of ultra-high electron mobility (up to 200,000 $cm^2/Vs$), since lack of a bandgap, application prospects of the graphene similar to transistors are poor.

In recent years, two-dimensional transistors have received widespread attention due to excellent performance. Chemical formula of transition metal dichalcogenide (TMD) is $MX_2$ type, M is a metal, X represents a chalcogen (such as S, Se, Te). Since the bandgap of the TMD is very close to that of silicon and is not affected by the short channel effect, it has often been used to prepare two-dimensional transistors in recent years.

However, large contact resistance at the interface between the two-dimensional semiconductor TMD film and any kind of bulk metal, which results in a significant increase in resistance between channel and source/drain region, reduces the performance of the two-dimensional transistors. On the other hand, current preparation methods of the two-dimensional transistors are mostly used in laboratory stage, and are not compatible with existing industrial CMOS process, so how to prepare large-scale two-dimensional transistors is an urgent problem to be solved.

SUMMARY

The technical problem to be solved by the present invention is to provide a transition metal dichalcogenide transistor and a preparation method thereof, which can effectively solve a problem of excessive contact resistance between the channel and the source/drain region of the transition metal dichalcogenide transistor, which can make the process of the transition metal dichalcogenide transistor is compatible with the existing CMOS process, and a small-sized, large-scale transition metal dichalcogenide transistor array can be conveniently prepared.

In order to achieve the above object, the present invention adopts the following technical solution: a transition metal dichalcogenide transistor, comprising: a gate, a gate dielectric layer and a channel layer from bottom to top, a source/drain region are located on both the sides of the gate dielectric layer, wherein, in a plane paralleled to the channel layer, the length of the channel layer in each direction is greater than the length of the gate dielectric layer, and the length of the gate dielectric layer in each direction is greater than or equal to the length of the gate; wherein, the source/drain region are a first transition metal dichalcogenide with metallic properties, and the channel layer is a second transition metal dichalcogenide with semiconductor properties.

Further, the first transition metal dichalcogenide is at least one of $MoTe_2$, $MoS_2$ and $WTe_2$.

Further, the second transition metal dichalcogenide is at least one of $MoTe_2$, $MoS_2$, $MoSe_2$, $WSe_2$, $ReSe_2$, $TaS_2$, $TaSe_2$, $TaTe_2$, $NbS_2$, $NbSe_2$ and $NbTe_2$.

Further, center points of the channel layer, the gate dielectric layer and the gate are located on the same straight line.

Further, further comprising a adhesion layer, which is between the gate dielectric layer and the channel layer, and in the plane paralleled to the channel layer, the length of the adhesion layer in each direction is equal to the length of the gate dielectric layer; the source region and the drain region of the source/drain region are located respectively on both the sides of the gate dielectric layer and the adhesive layer.

Further, the adhesion layer is lattice-matched with the second transition metal dichalcogenide.

Further, the heights of the source/drain region are greater than or equal to the height of the gate dielectric layer.

The preparation method for a transition metal dichalcogenide transistor provided by the present invention comprises following steps:

S01: providing a substrate, forming the interlayer dielectric layer on the substrate, and forming a groove on the upper surface of the interlayer dielectric layer;

S02: filling a gate material in the groove of the interlayer dielectric layer to form the gate;

S03: forming the gate dielectric layer above the gate, wherein, in the plane paralleled to the channel layer, the length of the gate dielectric layer in each direction is greater than or equal to the length of the gate;

S04: depositing the first transition metal dichalcogenide with metallic properties on the upper surfaces both of the gate dielectric layer and the interlayer dielectric layer, and removing the first transition metal dichalcogenide on the upper surface of the gate dielectric layer by photo-lithography and etching, and then doping the first transition metal dichalcogenide to form the source/drain region on both the sides of the gate dielectric layer;

S05: depositing the passivation layer on the upper surfaces both of the source/drain region and the gate dielectric layer, forming a groove on the upper surface of the gate dielectric layer by etching, and filling the groove with the second transition metal dichalcogenide with semiconductor properties to form the channel layer; wherein, in the plane paralleled to the channel layer, the length of the channel layer in each direction is greater than the length of the gate dielectric layer;

S06: forming extraction electrodes in the passivation layer and respectively connected with the source/drain region.

The preparation method for a transition metal dichalcogenide transistor provided by the present invention comprises the following steps:

S01: providing a substrate, forming the interlayer dielectric layer on the substrate, and forming a groove on the upper surface of the interlayer dielectric layer;

S02: filling a gate material in the groove of the interlayer dielectric layer to form the gate;

S03: forming a gate dielectric layer and an adhesion layer in sequence above the gate; wherein, in a plane paralleled to the channel layer, the length of the adhesion layer in each direction is equal to the length of the gate dielectric, and both lengths are greater than or equal to the length of the gate; the source region and the drain region are located on both the sides of the gate dielectric layer and the adhesion layer;

S04: depositing the first transition metal dichalcogenide with metallic properties on the upper surfaces both of the adhesion layer and the interlayer dielectric layer, and removing the first transition metal dichalcogenide on the upper surface of the adhesion layer by photolithography and etching, and then doping the first transition metal dichalcogenide to form the source/drain region on both the sides of the gate dielectric layer and the adhesion layer;

S05: depositing the passivation layer on the upper surfaces both of the source/drain region and the adhesion layer, forming a groove on the upper surface of the adhesion layer by etching, and filling the groove with the second transition metal dichalcogenide with semiconductor properties to form the channel layer; wherein, in the plane paralleled to the channel layer, the length of the channel layer in each direction is greater than the lengths both of the gate dielectric layer and the adhesion layer;

S06: forming extraction electrodes in the passivation layer and respectively connected with the source/drain region.

Further, for the source/drain region of NMOS, doping elements in the step S04 is one or more of As, P, and C; for the source/drain region of PMOS, the doping elements in the step S04 is B and/or Ge.

The beneficial effects of the present invention are: the present invention can effectively solve the problem of excessive contact resistance between the channel and the source/drain region of the transition metal dichalcogenide transistor by selecting the first transition metal dichalcogenide with metallic properties as the source/drain region, and the second transition metal dichalcogenide with semiconductor properties as the channel layer, and the preparation method of the present invention can make the process of the transition metal dichalcogenide transistor is compatible with the existing CMOS process, the preparation process is simple and feasible, and a small-sized, large-scale transition metal dichalcogenide transistor array can be conveniently prepared.

It is to be understood that the above general description and the following detailed description are merely exemplary and explanatory, but do not limit the disclosure.

In the pictures: 301 substrate, 302 interlayer dielectric layer, 303 groove in interlayer dielectric layer, 304 gate, 305 gate dielectric layer, 306 first transition metal dichalcogenide, 307 source/drain region, 308 passivation layer, 309 channel layer, 310 extraction electrodes, 405 adhesion layer.

DETAILED DESCRIPTION

Reference will now be made in detail to exemplary embodiments, Embodiments of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely Embodiments of apparatuses and methods consistent with aspects related to the disclosure as recited in the appended claims.

It is to be understood that "first", "second" and similar terms used in the specification and claims are not to represent any sequence, number or importance but only to distinguish different parts. Likewise, similar terms such as "a" or "an" also do not represent a number limit but represent "at least one". It is also to be understood that term "and/or" used in the present disclosure refers to and includes one or any or all possible combinations of multiple associated items that are listed.

Transition metal dichalcogenide comprises transition metal dichalcogenide with metallic properties and semiconductor properties; wherein, a transition metal dichalcogenide with metallic properties has metallic properties and no bandgap, with 2H crystalline phase, i.e., a Mitsubishi column structure; a transition metal dichalcogenide with semiconductor properties has semiconductor properties and a bandgap, with 1T crystalline phase, i.e., an octahedral structure. The above-mentioned transition metal dichalcogenide with different properties can be transition metal dichalcogenide with different chemical components, or a transition metal dichalcogenide with same chemical composition prepared by different growth conditions, such as controlling different deposition temperatures to form different phases, so as to have different electrical characteristics (metal or semiconductor properties). Two of the above-mentioned transition metal dichalcogenide with different properties can be seamlessly blended, and formed an ohmic contact between them.

A transition metal dichalcogenide transistor provided by the present invention comprises a gate, a gate dielectric layer and a channel layer from bottom to top, a source/drain region are located on both the sides of the gate dielectric layer. The source region and the drain region of the source/drain region are located respectively on both the sides of the gate dielectric layer. In a plane paralleled to the channel layer, the length of the channel layer in each direction is greater than the length of the gate dielectric layer, so as to ensure that the channel layer completely covers the gate dielectric layer, which ensures the channel layer effectively connects with the source/drain region located on both the sides of the gate dielectric layer; the length of the gate dielectric layer in each direction is greater than or equal to the length of the gate to ensure that the gate dielectric layer completely covers the gate. For example, if patterns of the channel layer, the gate dielectric layer and the gate are rectangular, in the plane paralleled to the channel layer and both of a channel direction and perpendicular to the channel direction, the length of the channel layer is greater than the length of the gate dielectric layer, so as to ensure that the channel layer completely covers the gate dielectric layer, and the length of the gate dielectric layer is greater than or equal to the length of the gate, so as to ensure that the gate dielectric layer completely covers the gate; if the patterns of the channel layer, the gate dielectric layer, and the gate are other patterns with multidirectional sizes, in the plane paralleled to the channel layer, the length of the channel layer in each direction is greater than the length of the gate dielectric layer, so as to ensure that the channel layer completely covers the gate dielectric layer; the length of the gate dielectric layer in each direction is greater than or equal to the length of the gate, so as to ensure that the gate dielectric layer completely covers the gate. Wherein, the source/drain region are a first transition metal dichalcogenide with metallic properties, and the channel layer is a second transition metal dichalcogenide with semiconductor properties.

In the present invention, the channel layer, the gate dielectric layer and the gate are paralleled to each other, therefore, a plane paralleled to the channel layer also is paralleled to the gate and the gate dielectric layer. When the gate, the gate dielectric layer and the channel layer are horizontal layers, the plane paralleled to the channel layer refers to the horizontal plane, in each direction of the horizontal plane, the length of the gate dielectric layer is greater than or equal to the length of the gate, which means the gate dielectric layer completely covers the gate, so as to prevent the source/drain region on both the sides from directly communicating with the gate; the length of the channel layer is greater than the length of the gate dielectric layer, which means the channel layer completely covers the gate, so as to ensure better contact between the channel layer of the second transition metal dichalcogenide and the source/drain region.

Since a large contact resistance at the interface between a semiconductor transition metal dichalcogenide and a metal, and the source/drain region need to use a conductive metal electrode for signal extraction; therefore, in the present invention, a first transition metal dichalcogenide with metallic properties is used as the source/drain regions, and the channel layer is formed by a second transition metal dichalcogenide with semiconductor properties; a good lattice match between the first and second transition metal dichalcogenide film, so as to form an ohmic contact between the channel layer and the source/drain region with an extremely small resistance. A first transition metal dichalcogenide film with metallic properties has no bandgap, and contacts with a metal electrode to form a metal contact with no contact resistance, so as to effectively reduce a contact resistance between the source/drain region and the metal electrode, and reduce a contact resistance between the source/drain region and the channel layer, so as to improve performances of a two-dimensional transistor. In addition, the preparation scheme proposed of the transition metal dichalcogenide transistor can be compatible with the existing Si-based CMOS process, and can realize a mass-produced transition metal dichalcogenide transistor array.

The following explains the present invention through two specific embodiments:

Embodiment 1

Please refer to FIGS. 1-8, a preparation method for a transition metal dichalcogenide transistor provided in this embodiment comprises the following steps:

S01: providing a substrate, forming the interlayer dielectric layer on the substrate, and forming a groove on the upper surface of the interlayer dielectric layer. For details, please refer to FIG. 1, a conventional semiconductor substrate 301 can be used, and an interlayer dielectric layer 302 is grown on the semiconductor substrate 301. The interlayer dielectric layer 202 can be formed by conventional materials. Then, a groove 303 is formed in the interlayer dielectric layer 302 by processes of photo-lithography and etching. In this embodiment, the depth of the groove 303 is 60 nm (nanometer).

S02: filling a gate material in the groove of the interlayer dielectric layer to form the gate. For details, please refer to FIG. 2, the gate material is deposited in the groove 303, and a polishing process is used to remove excess gate material outside of the groove 303, thereby forming a gate 304 in the groove. The gate material can be at least one of a metal and poly-silicon. In this embodiment, the gate material is Al.

S03: forming the gate dielectric layer above the gate, wherein, in the plane paralleled to the channel layer, the length of the gate dielectric layer in each direction is greater than or equal to the length of the gate. For details, please refer to FIG. 3, a gate dielectric layer material is deposited on the surfaces of the gate 304 and the interlayer dielectric layer 302, and a gate dielectric layer 305 is formed above the gate 304 by processes of photo-lithography and etching. The material of the gate dielectric layer can be at least one of $SiO_2$, SiN, SiON, a high-k dielectric material, a metal oxide, boron nitride, graphene, etc. When the shape of the channel layer is rectangular, in the plane parallel to the channel layer, in the horizontal direction in FIG. 3 and in the direction perpendicular to the paper surface, the length of the gate dielectric layer 305 is greater than or equal to the length of the gate 304, so as to ensure the gate dielectric layer completely covers the gate. In this embodiment, the material of the gate dielectric layer is boron nitride, and the thickness is 1.5 nm. The material of the gate dielectric layer can preferably be a lattice material deposited by a second transition metal dichalcogenide with semiconductor properties.

S04: depositing the first transition metal dichalcogenide with metallic properties on the upper surfaces both of the gate dielectric layer and the interlayer dielectric layer, and removing the first transition metal dichalcogenide on the upper surface of the gate dielectric layer by photo-lithography and etching, and then doping the first transition metal dichalcogenide to form the source/drain region on both the sides of the gate dielectric layer.

Figure 1:
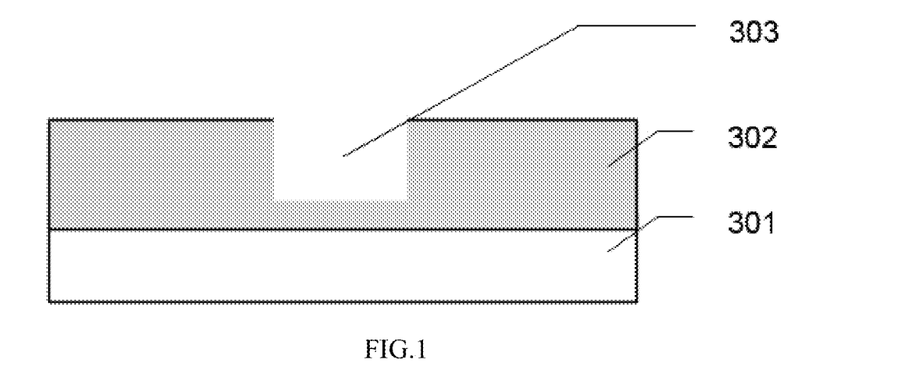
FIG. 1 is a schematic diagram of forming a groove on upper surface of an interlayer dielectric layer in Embodiment 1.
Figure 2:
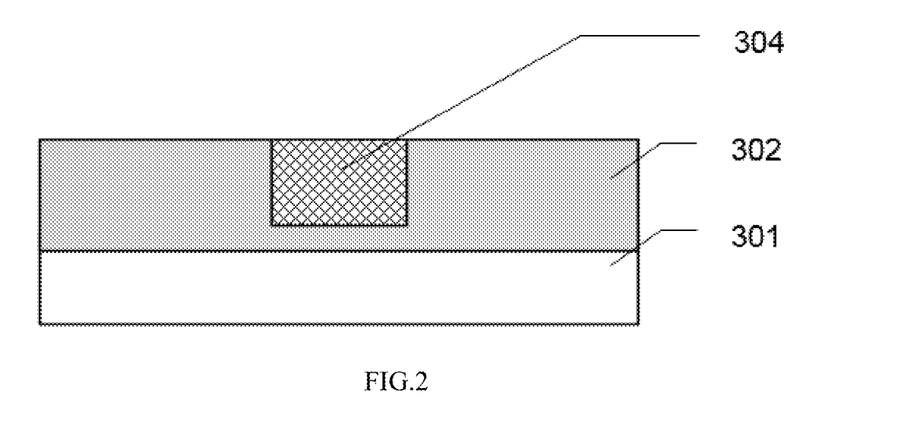
FIG. 2 is a schematic diagram of forming a gate in a groove of an interlayer dielectric layer in Embodiment 1.
Figure 3:
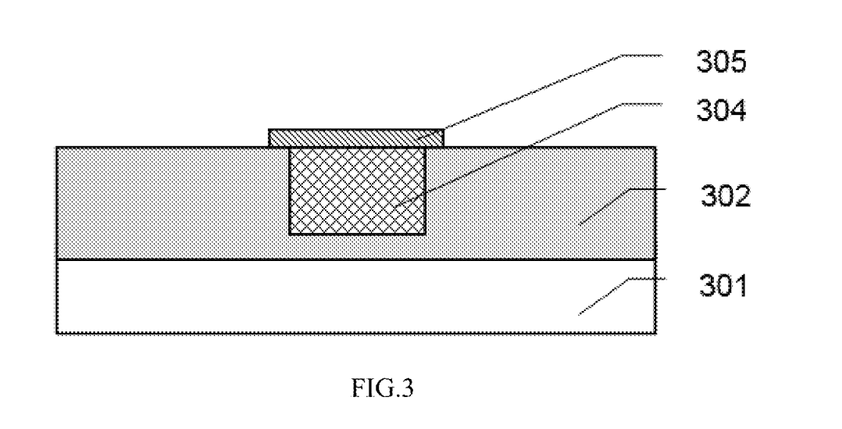
FIG. 3 is a schematic diagram of forming a gate dielectric layer in Embodiment 1.
Figure 4:
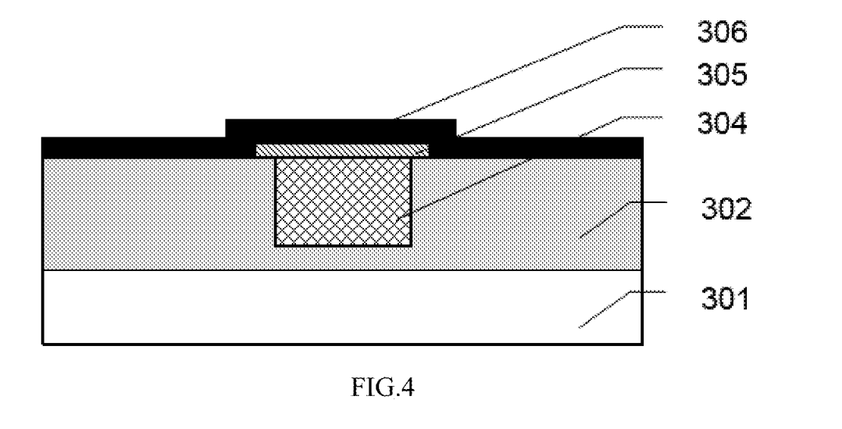
FIG. 4 is a schematic diagram of depositing a first transition metal dichalcogenide on a gate dielectric layer in Embodiment 1.

Significantly, the first transition metal dichalcogenide on the entire strip of the gate dielectric layer is removed by photo-lithography in the step, that is, the entire strip of the first transition metal dichalcogenide on the surface of the gate dielectric layer which perpendicular to the paper surface in FIG. 4 is removed, similar to form a structure with lines, thereby forming the source/drain region on both the sides of the gate dielectric layer.

Referring to FIG. 4, a first transition metal dichalcogenide 306 with metallic properties is formed on the gate dielectric layer and the interlayer dielectric layer through a deposition and/or a transfer process. The first transition metal dichalcogenide with metallic properties can be at least one of $MoTe_2$, $MoS_2$ and $WTe_2$. In this embodiment, the first transition metal dichalcogenide is $WTe_2$, and the thickness is 8 nm.

Figure 5:
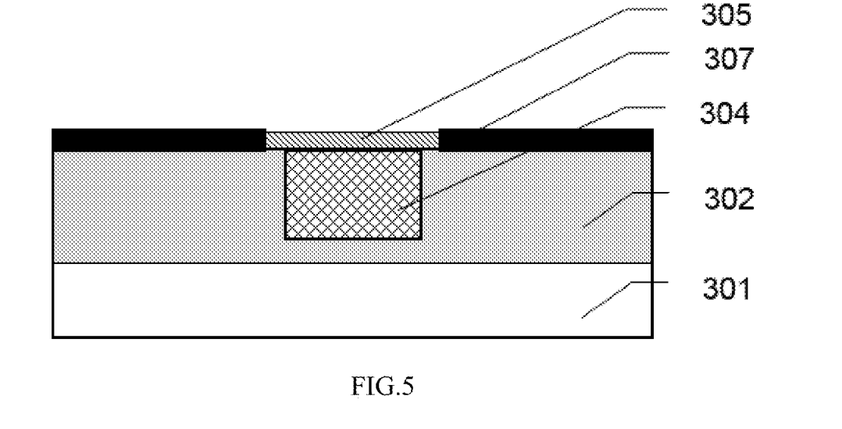
FIG. 5 is a schematic diagram of forming source and drain region in Embodiment 1.

Referring to FIG. 5, the first transition metal dichalcogenide 306 on the gate dielectric layer 305 is removed by processes of photo-lithography and etching, and then the first transition metal dichalcogenide on both the sides of the gate dielectric layer 305 is doped. For the source/drain region of NMOS, doping elements is one or more of As, P, and C; for the source/drain region of PMOS, the doping element is B and/or Ge, thereby a source/drain region 307 is formed.

Significantly, in this embodiment, the thickness of the first transition metal dichalcogenide 306 can be equal to or greater than the thickness of the gate dielectric layer, and after removing the first transition metal dichalcogenide above the gate dielectric layer, the heights of the source/drain region are equal to or higher than the height of the gate dielectric layer. When the heights of the source/drain region are higher than the height of the gate dielectric layer, both sides below the channel layer are located between the source/drain region, and the channel layer can be contacted well with the source/drain region.

S05: depositing the passivation layer on the upper surfaces both of the source/drain region and the gate dielectric layer, forming a groove on the upper surface of the gate dielectric layer by etching, and filling the groove with the second transition metal dichalcogenide with semiconductor properties to form the channel layer; wherein, in the plane paralleled to the channel layer, the length of the channel layer in each direction is greater than the length of the gate dielectric layer.

Figure 6:
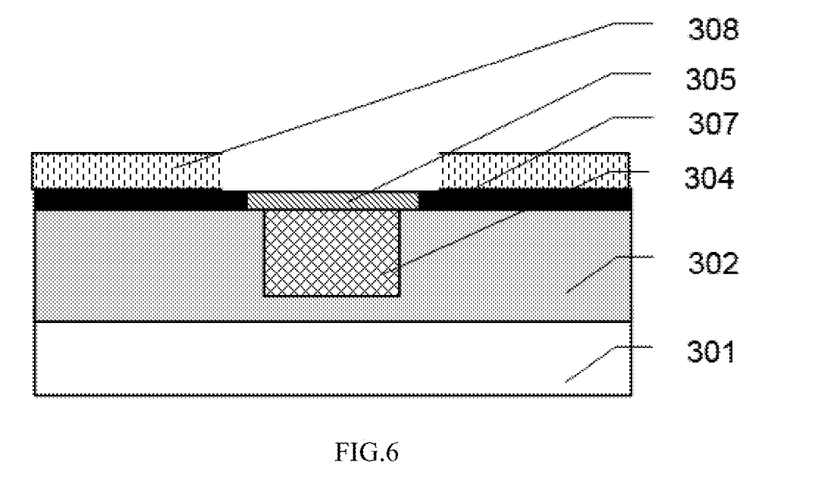
FIG. 6 is a schematic diagram of forming a groove in a passivation layer in Embodiment 1.

Referring to FIG. 6, a passivation layer 308 is deposited. The material of the passivation layer can be at least one of $SiO_2$, SiN, SiON and other low dielectric constant materials. In this embodiment, the passivation layer is $SiO_2$ and the thickness is 20 nm. A groove is formed on the upper surface of the gate dielectric layer through an etching process, and the groove is used to be filled to form a channel layer. In the plane parallel to the channel layer, and in the horizontal direction and the direction perpendicular to the paper as shown in FIG. 6, the length of the channel layer 309 is greater than the length of the gate dielectric layer 305, so as to ensure the channel layer completely covers the gate dielectric layer.

Figure 7:
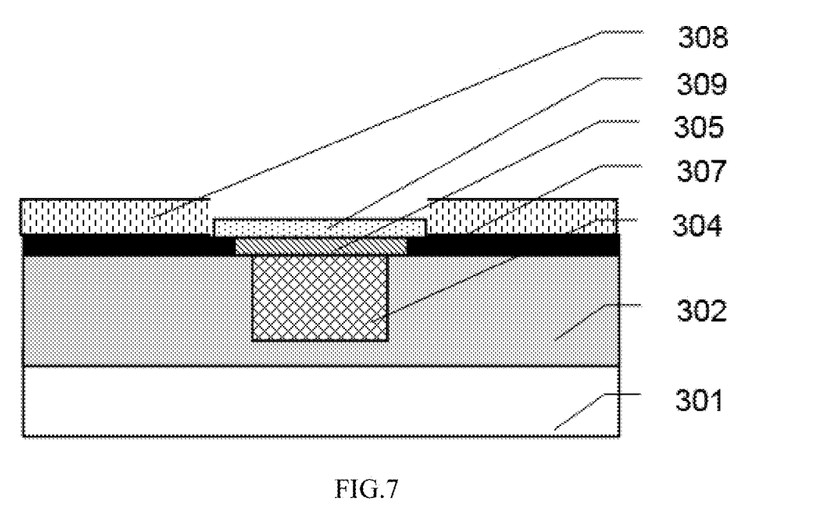
FIG. 7 is a schematic diagram of forming a channel layer in Embodiment 1.

Referring to FIG. 7, a second transition metal dichalcogenide with semiconductor properties is selectively deposited in the groove above the gate dielectric layer 305 to form a channel layer 309. The lattice of the gate dielectric layer material matches the lattice of the second transition metal dichalcogenide. In this embodiment, the second transition metal dichalcogenide is $WSe_2$, and the thickness is 5 nm. Boron nitride is used to form the gate dielectric layer and its lattice is favorable for the deposition and growth of $WSe_2$ with semiconductor properties, so the second transition metal dichalcogenide with semiconductor properties as the channel layer can be self-aligned deposited on the gate dielectric layer.

Figure 8:
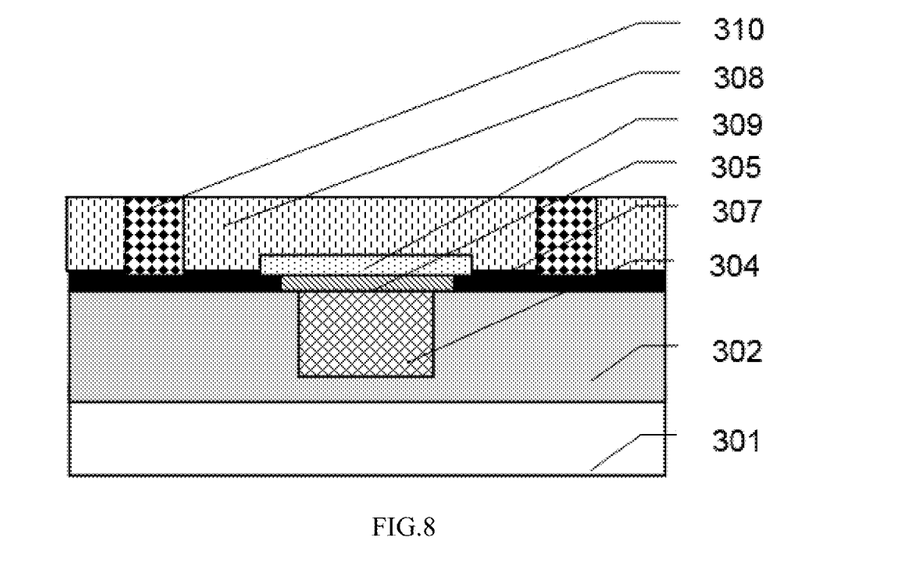
FIG. 8 is a transition metal dichalcogenide transistor prepared in Embodiment 1.

S06: forming extraction electrodes in the passivation layer and respectively connected with the source/drain region. Referring to FIG. 8, a groove is formed in the passivation layer above the source region, and a metal electrode is filled in the groove, and extraction electrodes 310 are formed by a process such as polishing to lead out the source/drain region.

The transition metal dichalcogenide transistor provided in this embodiment, as shown in FIG. 8, comprises the substrate 301, the interlayer dielectric layer 302, the gate 304, the gate dielectric layer 305 and the source/drain region 307, the channel layer 309, the passivation layer 308, and the extraction electrodes 310 from bottom to top.

The interlayer dielectric layer 302 is located between the substrate 301 and the source/drain region 307, the interlayer dielectric layer 302 is located below the source/drain region 307 and the gate dielectric layer 305, and wraps the side and lower surfaces of the gate 304. The gate dielectric layer 305 is located directly above the gate 304, and in the plane parallel to the channel layer, the length of the gate dielectric layer 305 in each direction is greater than or equal to the length of the gate 304. The source region and the drain region in the source/drain region 307 are located respectively on both the sides of the gate dielectric layer 305. The channel layer 309 is located directly above the gate dielectric layer 305, and in the plane parallel to the channel layer, the length of the channel layer 309 in each direction is greater than the length of the gate dielectric layer 305. The passivation layer 308 is located above the source/drain region 307 and the channel layer 309, and wraps the side and upper surfaces of the channel layer 309. The extraction electrodes 310 are located in the passivation layer 308 and used to lead the source/drain region 307 out. In the present invention, the source/drain region are a first transition metal dichalcogenide with metallic properties, and the channel layer is a second transition metal dichalcogenide with semiconductor properties.

Embodiment 2

This embodiment provides a preparation method for a transition metal dichalcogenide transistor. Steps S01 and S02 are the same as those in Embodiment 1, and specifically include the following steps:

S01: providing a substrate, forming the interlayer dielectric layer on the substrate, and forming a groove on the upper surface of the interlayer dielectric layer.

S02: filling a gate material in the groove of the interlayer dielectric layer to form the gate.

S03: forming a gate dielectric layer and an adhesion layer in sequence above the gate; wherein, in a plane paralleled to the channel layer, the length of the adhesion layer in each direction is equal to the length of the gate dielectric, and both lengths are greater than or equal to the length of the gate.

Figure 9:
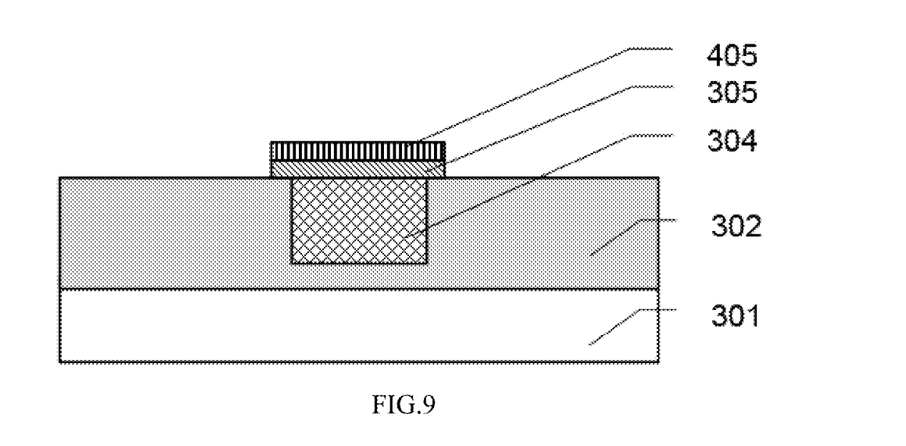
FIG. 9 is a schematic diagram after forming an adhesive layer in Embodiment 2.

For details, please refer to FIG. 9, the gate dielectric layer 305 and an adhesion layer 405 are deposited on the surfaces of the gate 304 and the interlayer dielectric layer 302, and the gate dielectric layer 305 and an adhesion layer 405 are located above gate 304 by processes of photo-lithography and etching. The material of the gate dielectric layer can be at least one of $SiO_2$, SiN, SiON, a high-k dielectric material, a metal oxide, boron nitride, graphene, etc. The material of the adhesion layer can be a material that matches the crystal lattice of the second transition metal dichalcogenide. In this embodiment, the material of the gate dielectric layer is $HfO_2$, and the thickness is 1.5 nm. The material of the adhesion layer is boron nitride and the thickness is 2 nm. Moreover, in the plane paralleled to the channel layer, in the horizontal direction in FIG. 9 and in the direction perpendicular to the paper surface, the lengths of the gate dielectric layer 305 and the adhesion layer 405 are equal, and both are greater than or equal to the length of gate 304, that is, both of the gate dielectric layer 305 and the adhesion layer 405 completely cover the gate 304. In this embodiment, the adhesion layer is added above the gate dielectric layer, the two sides of the gate dielectric layer are the gate layer and the adhesive layer respectively, because of a higher K value of the gate dielectric layer, the thickness of the gate dielectric layer is thicker upon the same EOT, and reliability of devices is better, but the lattice of the gate dielectric layer with the high K value may not match with the second transition metal dichalcogenide (the channel layer in the present invention), in order to be compatible with the characteristics of both the high-K gate dielectric layer and the lattices of the second transition metal dichalcogenide, this embodiment separates the adhesion layer and the gate dielectric layer.

S04: depositing the first transition metal dichalcogenide with metallic properties on the upper surfaces both of the adhesion layer and the interlayer dielectric layer, and removing the first transition metal dichalcogenide on the upper surface of the adhesion layer by photo-lithography and etching, and then doping to form the source/drain region on both the sides of the gate dielectric layer. This step is the same as step S04 in Embodiment 1.

The first transition metal dichalcogenide with metallic properties is deposited on the gate dielectric layer and the interlayer dielectric layer through a deposition process and/ or a transfer process. The first transition metal dichalcogenide on the gate dielectric layer is removed by processes of photo-lithography and etching to form the source/drain region.

The first transition metal dichalcogenide with metallic properties is at least one of $MoTe_2$, $MoS_2$ and $WTe_2$. In this embodiment, the first transition metal dichalcogenide is $WTe_2$, and the thickness is 8 nm.

After removal, the first transition metal dichalcogenide on both the sides of the gate dielectric layer 305 is doped. For the source/drain region of NMOS, doping elements is one or more of As, P, and C; for the source/drain region of PMOS, the doping elements are B and/or Ge, thereby a source/drain region 307 is formed.

In this embodiment, different deposition temperatures can be used to form different phase states. For example, the first transition metal dichalcogenide is a $MoTe_2$ film with metallic properties prepared by a chemical vapor deposition at a temperature greater than or equal to 710° C., and the second transition metal dichalcogenide is a $MoTe_2$ film with semiconductor properties prepared by a chemical vapor deposition at a temperature less than or equal to 670° C. Although TMD films of the same chemical composition have different electrical properties, contact resistance between the TMD films is very small, which can solve a problem of excessive contact resistance between transition metal dichalcogenide transistor channel and metal source/drain region in a transition metal dichalcogenide transistor.

S05: depositing the passivation layer on the upper surfaces both of the source/drain region and the adhesion layer, forming a groove on the upper surface of the adhesion layer by etching, and filling the groove with the second transition metal dichalcogenide with semiconductor properties to form the channel layer; wherein, in the plane paralleled to the channel layer, the length of the channel layer in each direction is greater than the lengths both of the gate dielectric layer and the adhesion layer. This step is the same as step S05 in Embodiment 1.

S06: forming extraction electrodes in the passivation layer and respectively connected with the source/drain region.

Figure 10:
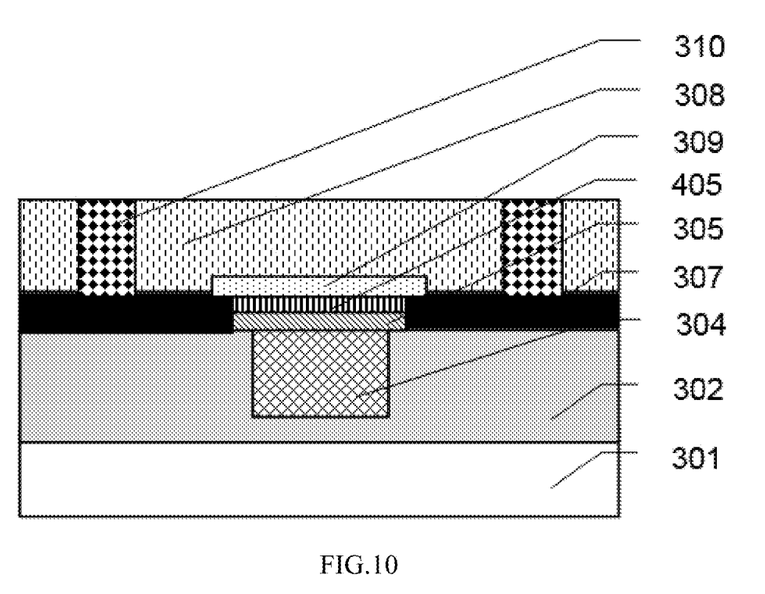
FIG. 10 shows a transition metal dichalcogenide transistor prepared in Embodiment 2.

Referring to FIG. 10, a groove is formed in the passivation layer above the source region, and a metal electrode is filled in the groove, and then extraction electrodes 310 for connecting with the source/drain region are formed through a process such as polishing.

The transition metal dichalcogenide transistor provided in this embodiment, as shown in FIG. 10, comprises the substrate 301, the interlayer dielectric layer 302, the gate 304, the gate dielectric layer 305 and the adhesion layer 405 and the source/drain region 307, the channel layer 309, the passivation layer 308 and the extraction electrodes 310 from bottom to top. The interlayer dielectric layer 302 is located between the substrate 301 and the source/drain region 307, the interlayer dielectric layer 302 is located below the source/drain region 307 and the gate dielectric layer 305, and wraps the side and lower surfaces of the gate 304. The gate dielectric layer 305 and the adhesion layer 405 are located directly above the gate 304 in sequence, and in the plane parallel to the channel layer, the length of the gate dielectric layer 305 in each direction is equal to the length of the adhesion layer 405, and both of the lengths are greater than or equal to the length of the gate 304. The source region and the drain region of the source/drain region 307 are located respectively on both the sides of the gate dielectric layer 305 and the adhesion layer 405. The channel layer 309 is directly above the adhesion layer 405, and in the plane parallel to the channel layer, the length of the channel layer 309 in each direction is greater than the lengths of the gate dielectric layer 305 and the adhesion layer 405. The passivation layer 308 is located above the source/drain region 307 and the channel layer 309, and wraps the side and upper surfaces of the channel layer 309. The extraction electrodes 310 are located in the passivation layer 308 and used to lead the source/drain region 307 out. In the present invention, the source/drain region are a first transition metal dichalcogenide with metallic properties, and the channel layer is a second transition metal dichalcogenide with semiconductor properties.

Other embodiments of the disclosure will be apparent to those skilled in the art from consideration of the specification and practice of the disclosure here. This application is intended to cover any variations, uses, or adaptations of the disclosure following the general principles thereof and including such departures from the disclosure as come within known or customary practice in the art. It is intended that the specification and embodiments be considered as exemplary only, with a true scope and spirit of the disclosure being indicated by the following claims.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A transition metal dichalcogenide transistor, comprising: a gate, a gate dielectric layer and a channel layer from bottom to top, a source/drain region are located on both sides of the gate dielectric layer, wherein, in a plane paralleled to the channel layer, the length of the channel layer in each direction is greater than the length of the gate dielectric layer, and the length of the gate dielectric layer in each direction is greater than or equal to the length of the gate; wherein, the source/drain region are a first transition metal dichalcogenide with metallic properties, and the channel layer is a second transition metal dichalcogenide with semiconductor properties.

2. The transition metal dichalcogenide transistor of claim 1, wherein the first transition metal dichalcogenide is at least one of $MoTe_2$, $MoS_2$ and $WTe_2$.

3. The transition metal dichalcogenide transistor of claim 1, wherein the second transition metal dichalcogenide is at least one of $MoTe_2$, $MoS_2$, $MoSe_2$, $WSe_2$, $ReSe_2$, $TaS_2$, $TaSe_2$, $TaTe_2$, $NbS_2$, $NbSe_2$ and $NbTe_2$.

4. The transition metal dichalcogenide transistor of claim 1, wherein center points of the channel layer, the gate dielectric layer and the gate are located on the same straight line.

5. The transition metal dichalcogenide transistor of claim 1, wherein further comprising an adhesion layer, which is between the gate dielectric layer and the channel layer, and in the plane paralleled to the channel layer, the length of the adhesion layer in each direction is equal to the length of the gate dielectric layer; the source region and the drain region of the source/drain region are located respectively on both the sides of the gate dielectric layer and the adhesive layer.

6. The transition metal dichalcogenide transistor of claim 5, wherein the adhesion layer is lattice-matched with the second transition metal dichalcogenide.

7. A preparation method for a transition metal dichalcogenide transistor of claim 5, comprising: S01: providing a substrate, forming the interlayer dielectric layer on the substrate, and forming a groove on the upper surface of the interlayer dielectric layer;
S02: filling a gate material in the groove of the interlayer dielectric layer to form the gate;
S03: forming a gate dielectric layer and an adhesion layer in sequence above the gate;
wherein, in a plane paralleled to the channel layer, the length of the adhesion layer in each direction is equal to the length of the gate dielectric, and both lengths are greater than or equal to the length of the gate; the source region and the drain region are respectively located on both the sides of the gate dielectric layer and the adhesion layer;
S04: depositing the first transition metal dichalcogenide with metallic properties on the upper surfaces both of the adhesion layer and the interlayer dielectric layer, and removing the first transition metal dichalcogenide on the upper surface of the adhesion layer by photo-lithography and etching, and then doping to form the source/drain region on both the sides of the gate dielectric layer and the adhesion layer;
S05: depositing the passivation layer on the upper surfaces both of the source/drain region and the adhesion layer, forming a groove on the upper surface of the adhesion layer by etching, and filling the groove with the second transition metal dichalcogenide with semiconductor properties to form the channel layer; wherein, in the plane paralleled to the channel layer, the length of the channel layer in each direction is greater than the lengths both of the gate dielectric layer and the adhesion layer;
S06: forming extraction electrodes in the passivation layer and respectively connected with the source/drain region.

8. The method of claim 7, wherein, for the source/drain region of NMOS, doping elements in the step S04 is one or more of As, P, and C; for the source/drain region of PMOS, the doping elements in the step S04 is B and/or Ge.

9. The transition metal dichalcogenide transistor of claim 1, wherein the heights of the source/drain region are greater than or equal to the height of the gate dielectric layer.

10. A preparation method for a transition metal dichalcogenide transistor of claim 1, comprising: S01: providing a substrate, forming the interlayer dielectric layer on the substrate, and forming a groove on the upper surface of the interlayer dielectric layer;
S02: filling a gate material in the groove of the interlayer dielectric layer to form the gate;
S03: forming the gate dielectric layer above the gate, wherein, in the plane paralleled to the channel layer, the length of the gate dielectric layer in each direction is greater than or equal to the length of the gate;
S04: depositing the first transition metal dichalcogenide with metallic properties on the upper surfaces both of the gate dielectric layer and the interlayer dielectric layer, and removing the first transition metal dichalcogenide on the upper surface of the gate dielectric layer by photo-lithography and etching, and then doping to form the source/drain region on both the sides of the gate dielectric layer;
S05: depositing the passivation layer on the upper surfaces both of the source/drain region and the gate dielectric layer, forming a groove on the upper surface of the gate dielectric layer by etching, and filling the groove with the second transition metal dichalcogenide with semiconductor properties to form the channel layer; wherein, in the plane paralleled to the channel layer, the length of the channel layer in each direction is greater than the length of the gate dielectric layer;
S06: forming extraction electrodes in the passivation layer and respectively connected with the source/drain region.

11. The method of claim 10, wherein, for the source/drain region of NMOS, doping elements in the step S04 is one or more of As, P, and C; for the source/drain region of PMOS, the doping elements in the step S04 is B and/or Ge.

* * * * *